United States Patent
Felton et al.

(10) Patent No.: US 9,231,357 B1
(45) Date of Patent: Jan. 5, 2016

(54) MID-PLANE ASSEMBLY

(71) Applicant: EMC Corporation, Hopkinton, MA (US)

(72) Inventors: Mickey S. Felton, Sterling, MA (US);
Eddy M. Paul, Shrewsbury, MA (US);
Ralph C. Frangioso, Franklin, MA (US)

(73) Assignee: EMC Corporation, Hopkinton, MA (US)

( * ) Notice: Subject to any disclaimer, the term of this patent is extended or adjusted under 35 U.S.C. 154(b) by 164 days.

(21) Appl. No.: 14/042,411

(22) Filed: Sep. 30, 2013

(51) Int. Cl.
*G06F 1/16* (2006.01)
*H01R 31/06* (2006.01)
*H05K 7/14* (2006.01)

(52) U.S. Cl.
CPC .............. *H01R 31/06* (2013.01); *H05K 7/1485* (2013.01)

(58) Field of Classification Search
CPC .................................. G06F 1/187; G06F 1/16
USPC .................................................... 361/679.33
See application file for complete search history.

(56) References Cited

U.S. PATENT DOCUMENTS

| | | | |
|---|---|---|---|
| 6,174,175 B1* | 1/2001 | Behfar et al. | 439/91 |
| 7,098,078 B2* | 8/2006 | Khandros et al. | 438/118 |
| 8,625,303 B2* | 1/2014 | Yin et al. | 361/803 |
| 2001/0045611 A1* | 11/2001 | Clatanoff et al. | 257/449 |
| 2004/0193791 A1* | 9/2004 | Felton et al. | 711/112 |
| 2007/0075726 A1* | 4/2007 | Chan et al. | 324/765 |
| 2007/0117416 A1* | 5/2007 | Peterson et al. | 439/64 |
| 2007/0141895 A1* | 6/2007 | Karstens | 439/490 |
| 2009/0075494 A1* | 3/2009 | Crighton | 439/62 |

\* cited by examiner

*Primary Examiner* — Forrest M Phillips
(74) *Attorney, Agent, or Firm* — Brian J. Colandreo; Mark H. Whittenberger; Holland & Knight LLP

(57) ABSTRACT

A mid-plane assembly for use in an IT device includes a circuit board having a first surface and a second surface. At least one drive connector is positioned on the first surface of the circuit board. At least one board connector is positioned on the second surface of the circuit board and at least partially behind the at least one drive connector positioned on the first surface.

25 Claims, 4 Drawing Sheets

(top view)

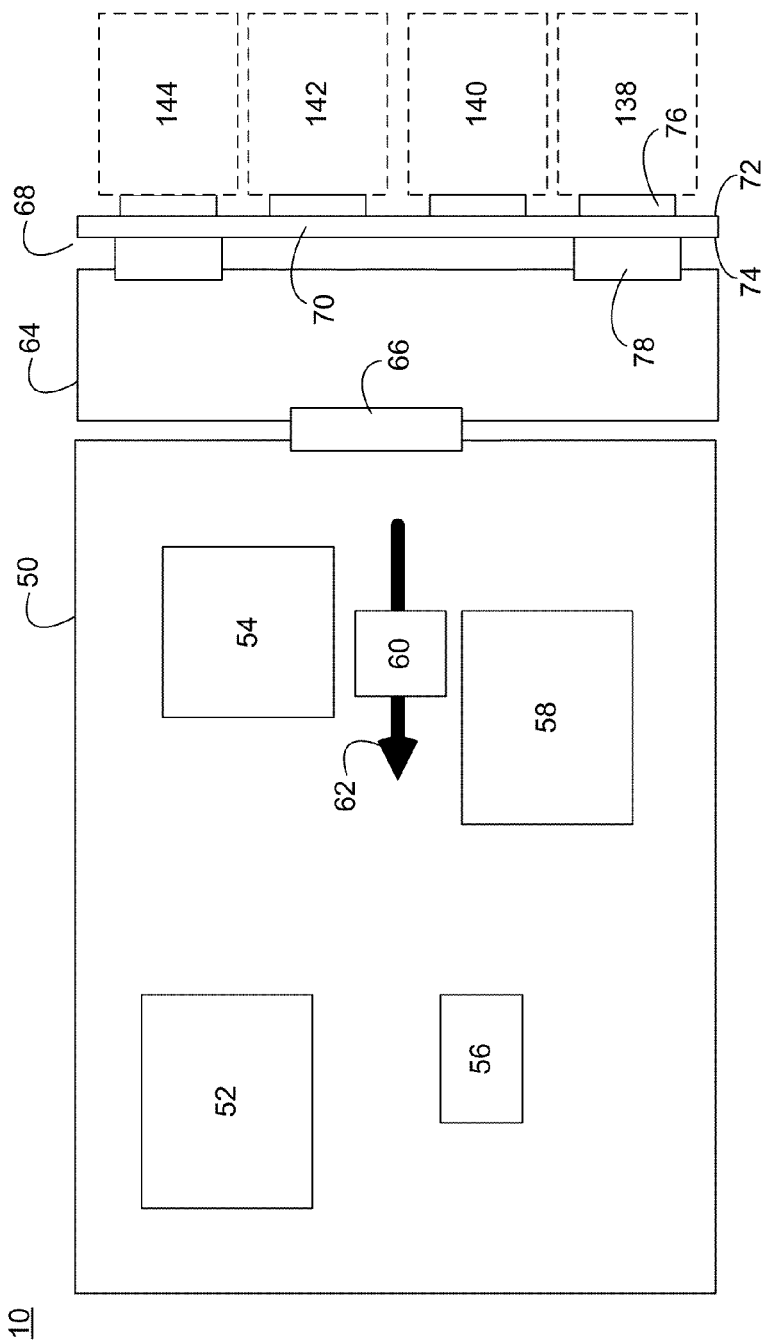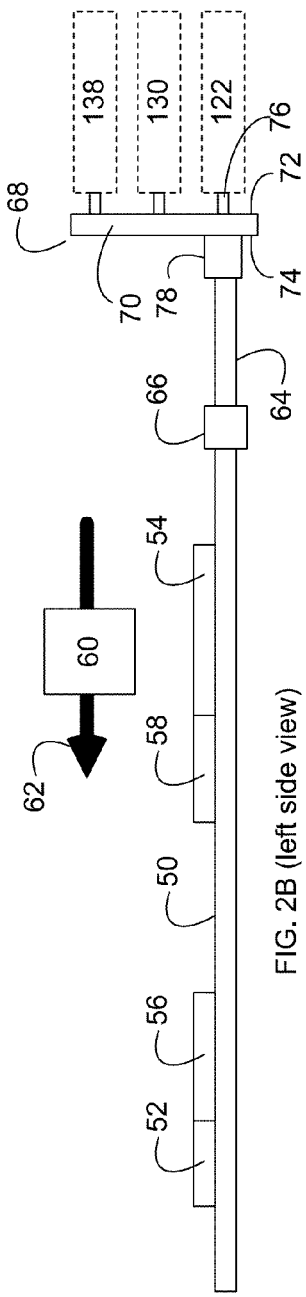
FIG. 2A (top view)
FIG. 2B (left side view)

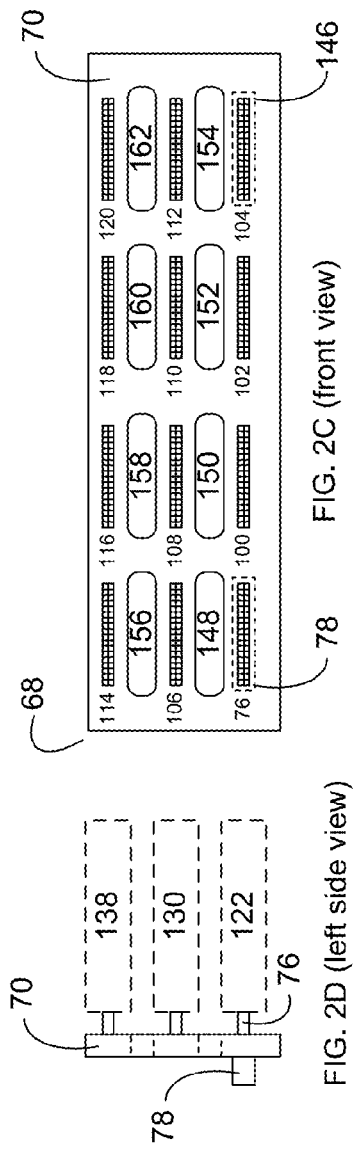

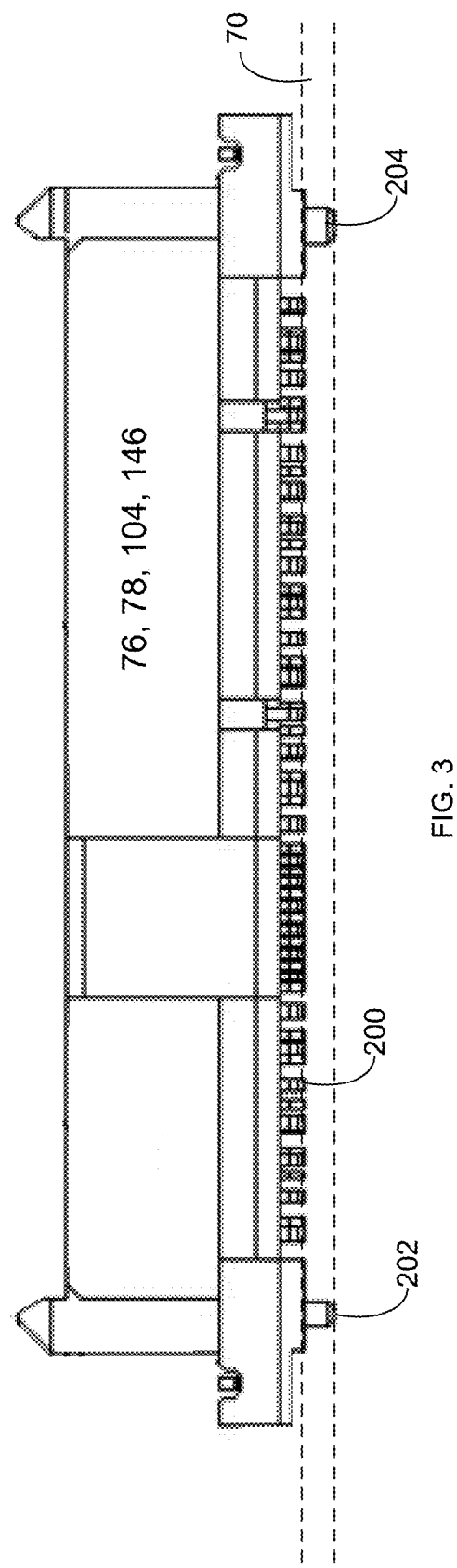

MID-PLANE ASSEMBLY

TECHNICAL FIELD

This disclosure relates to mid-plane assemblies and, more particularly, to mid-plane assemblies for use in high availability devices.

BACKGROUND

In today's IT infrastructure, high availability is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

When designing such high availability devices, extensive testing may be performed to ensure their functionality and reliability. In light of the use of more powerful microprocessors, the ability to cool such high availability devices is of critical importance.

SUMMARY OF DISCLOSURE

In one implementation, a mid-plane assembly for use in an IT device includes a circuit board having a first surface and a second surface. At least one drive connector is positioned on the first surface of the circuit board. At least one board connector is positioned on the second surface of the circuit board and at least partially behind the at least one drive connector positioned on the first surface.

One or more of the following features may be included. The at least one drive connector may include one or more pinless electrical connectors. The one or more pinless electrical connectors of the at least one drive connector may be electrically coupled to the circuit board using a reflow solder process. The at least one board connector may include one or more pinless electrical connectors. The one or more pinless electrical connectors of the at least one board connector may be electrically coupled to the circuit board using a reflow solder process. The at least one drive connector may include a plurality of drive connectors that are configured to electrically couple the circuit board to a plurality of disk drives. The at least one board connector may be configured to electrically couple the circuit board to a drive controller system that is configured to access the plurality of disk drives. The at least one board connector may include a plurality of board connectors that are configured to electrically couple the circuit board to a drive controller system. The circuit board may include a plurality of cooling passages configured to allow for the circulation of cooling air. The mid-plane assembly may be configured for use in a high availability storage system.

In another implementation, an IT device includes a system board and a drive controller system electrically coupled to the system board. A mid-plane assembly is electrically coupled to the drive controller system. The mid-plane assembly includes a circuit board having a first surface and a second surface. At least one drive connector is positioned on the first surface of the circuit board. At least one board connector is positioned on the second surface of the circuit board and at least partially behind the at least one drive connector positioned on the first surface.

One or more of the following features may be included. The at least one drive connector may include one or more pinless electrical connectors. The one or more pinless electrical connectors of the at least one drive connector may be electrically coupled to the circuit board using a reflow solder process. The at least one board connector may include one or more pinless electrical connectors. The one or more pinless electrical connectors of the at least one board connector may be electrically coupled to the circuit board using a reflow solder process. The at least one drive connector may include a plurality of drive connectors that are configured to electrically couple the circuit board to a plurality of disk drives. The at least one board connector may be configured to electrically couple the circuit board to the drive controller system, wherein the drive controller system may be configured to access the plurality of disk drives. The at least one board connector may include a plurality of board connectors that are configured to electrically couple the circuit board to the drive controller system. The circuit board may include a plurality of cooling passages configured to allow for the circulation of cooling air. The IT device may be configured for use in a high availability storage system.

In another implementation, a mid-plane assembly for use in an IT device includes a circuit board having a first surface and a second surface. At least one drive connector is positioned on the first surface of the circuit board. The at least one drive connector includes one or more pinless electrical connectors. At least one board connector is positioned on the second surface of the circuit board and at least partially behind the at least one drive connector positioned on the first surface. The at least one board connector includes one or more pinless electrical connectors.

One or more of the following features may be included. The at least one drive connector may include a plurality of drive connectors that are configured to electrically couple the circuit board to a plurality of disk drives. The at least one board connector may be configured to electrically couple the circuit board to a drive controller system that may be configured to access the plurality of disk drives. The circuit board may include a plurality of cooling passages configured to allow for the circulation of cooling air. The mid-plane assembly may be configured for use in a high availability storage system.

The details of one or more implementations are set forth in the accompanying drawings and the description below. Other features and advantages will become apparent from the description, the drawings, and the claims.

BRIEF DESCRIPTION OF THE DRAWINGS

FIGS. 2A & 2B are diagrammatic views of a system board, drive controller system, and mid-plane assembly included within the IT device of FIG. 1;

FIGS. 2C, 2D, 2E & 2F are diagrammatic views of the mid-plane assembly of FIGS. 2A & 2B;

FIG. 2G is a diagrammatic view of a drive array for electrically coupling to the mid-plane assembly of FIGS. 2C, 2D, 2E & 2F; and FIG. 3 is a diagrammatic view of a connector assembly included on the mid-plane assembly of FIGS. 2C, 2D, 2E & 2F.

Like reference symbols in the various drawings indicate like elements.

DETAILED DESCRIPTION OF THE PREFERRED EMBODIMENTS

Figure 1:
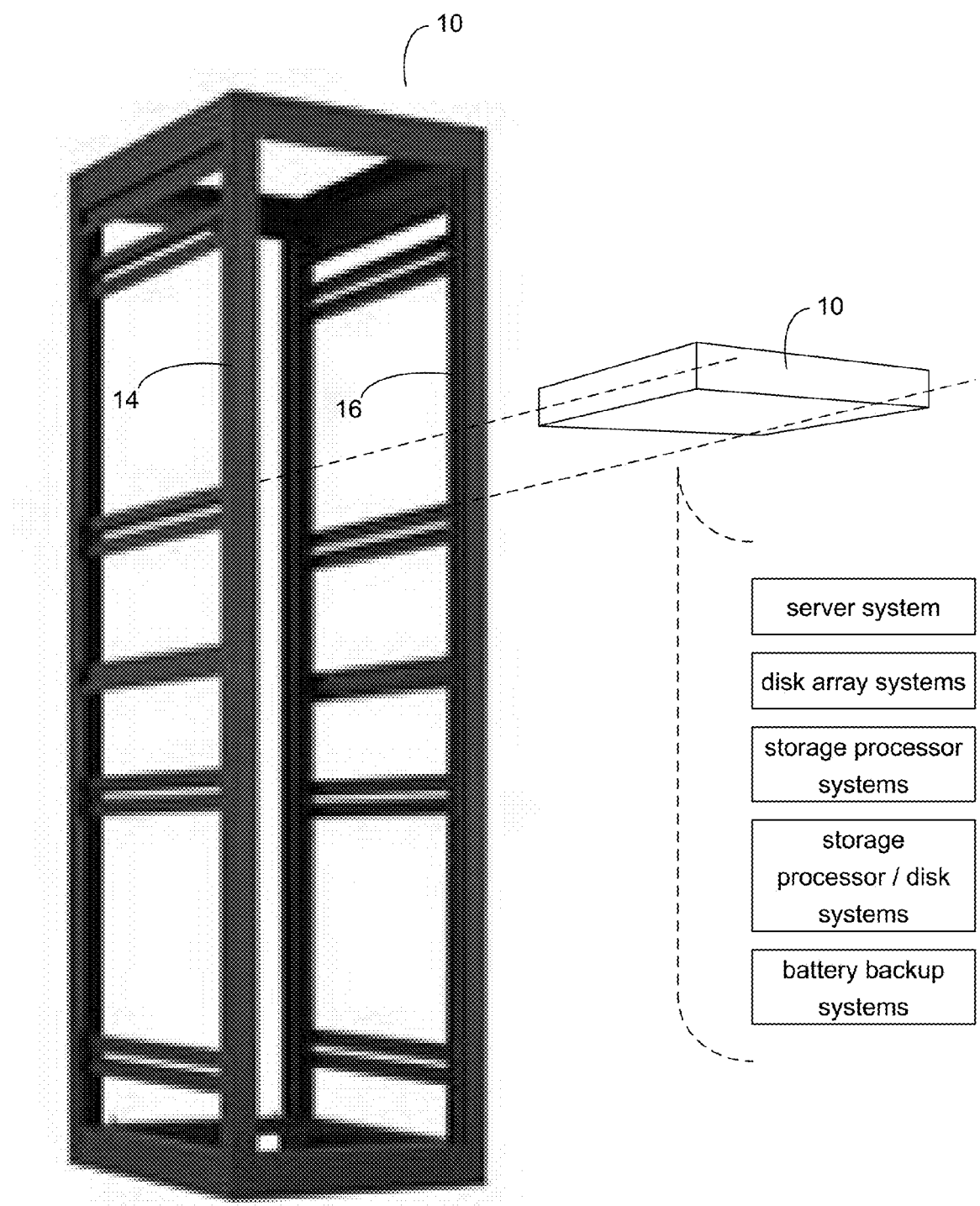
FIG. 1 is a perspective view of an IT rack and an IT device.

Referring to FIG. 1, IT devices (e.g., IT device 10) may be utilized by organizations to process and store data. Examples of IT device 10 may include but are not limited to the various components of high-availability storage systems, such as: server systems, disk array systems, storage processor systems, storage processor/disk systems, and battery backup systems.

IT racks (e.g., IT rack 12) may be utilized to store and organize these IT devices (e.g., IT device 10). For example, IT rack 12 may be placed within a computer room and various IT devices may be attached to rails (e.g., NEMA rails 14, 16) included within IT rack 12, wherein these rails (e.g., NEMA rails 14, 16) may have a standard and defined spacing between them (e.g., 19"). Typically, IT devices that are configured to fit within IT rack 12 may be described as rack-mountable IT devices. Alternatively. IT device 10 may be a free-standing device that does not require an IT rack for mounting.

Referring also to FIGS. 2A and 2B, positioned within IT device 10 may be one or more system boards (e.g., system board 50) that may include a plurality of circuits 52, 54, 56, 58, examples of which may include but are not limited to microprocessors, memory circuits, voltage regulator circuits, and memory controller circuits. IT device 10 may include a fan system (e.g., fan system 60) that may be configured to circulate cooling air (e.g., cooling air 62) through IT device 10.

IT device 10 may include a drive controller system (e.g., drive controller system 64) that may be electrically coupled (via electrical connector 66) to system board 50. A mid-plane assembly (e.g., mid-plane assembly 68) may be electrically coupled to drive controller system 64. Mid-plane assembly 68 may include circuit board 70 having first surface 72 and second surface 74. At least one drive connector (e.g., drive connector 76) may be positioned on first surface 72 of circuit board 70. At least one board connector (e.g., board connector 78) may be positioned on second surface 74 of circuit board 70 and at least partially behind the at least one drive connector (e.g., drive connector 76) positioned on first surface 72.

Referring also to FIGS. 2C, 2D, 2E and 2F, there is shown a front view (FIG. 2C), left side view (FIG. 2D), right side view (FIG. 2E) and back view (FIG. 2F) of mid-plane assembly 68. The at least one drive connector positioned on first surface 72 of circuit board 70 may include a plurality of drive connectors (e.g., drive connectors 76, 100, 102, 104, 106, 108, 110, 112, 114, 116, 118, 120) that are configured to electrically couple circuit board 70 to a plurality of disk drives (e.g., disk drives 122, 124, 126, 128, 130, 132, 134, 136, 138, 140, 142, 144, respectively), as shown in FIG. 2G. Disk drives 122, 124, 126, 128, 130, 132, 134, 136, 138, 140, 142, 144 may be hot-swappable disk drives that may be coupled to and/or decoupled from circuit board 70 during the operation of IT device 10. While, in this example, mid-plane assembly 68 is shown to accommodate twelve disk drives, this is for illustrative purposes only, as the actual number of drives may be increased/decreased based upon design criteria.

The at least one board connector (e.g., board connector 78) positioned on second surface 74 of circuit board 70 may be configured to electrically couple circuit board 70 to drive controller system 64. Drive controller system 64 may be configured to access (e.g., write data to and read data from) the plurality of disk drives (e.g., disk drives 122, 124, 126, 128, 130, 132, 134, 136, 138, 140, 142, 144). Depending upon the configuration of IT device 10, the at least one board connector may include a plurality of board connectors that are configured to electrically couple circuit board 70 to drive controller system 64. For example and as shown in FIGS. 2C, 2D, 2E and 2F, IT device 10 is shown to include two board connectors, namely board connectors 78, 146 that are configured to electrically couple circuit board 70 to drive controller system 64.

Circuit board 70 may include a plurality of cooling passages (e.g., cooling passages 148, 150, 152, 154, 156, 158, 160, 162) that may be configured to allow for the circulation (e.g., by fan system 60) of cooling air (e.g., cooling air 62) through IT device 10.

As discussed above, the at least one board connector (e.g., board connector 78) may be positioned on second surface 74 of circuit board 70 and at least partially behind the at least one drive connector (e.g., drive connector 76) positioned on first surface 72. Accordingly, by aligning one or more of these board connectors (e.g., one or more of board connectors 78, 146 and/or drive connectors 76, 104), the plurality of cooling passages (e.g., cooling passages 148, 150, 152, 154, 156, 158, 160, 162) may be enlarged, as the surface area of circuit board 70 may be reduced, thus freeing up space for enlarging one or more of the cooling passages (e.g., cooling passages 148, 150, 152, 154, 156, 158, 160, 162).

Referring also to FIG. 3, there is shown a detail view of an example of the connectors that may be positioned behind each other of opposite surfaces (e.g., surfaces 72, 74) of circuit board 70, namely board connector 78 (that is positioned behind drive connector 76) and board connector 146 (that is positioned behind drive connector 104).

These connectors (namely board connectors 78, 146 and drive connectors 76, 104) may be configured to include one or more pinless electrical connectors (e.g., pinless connector 200) that may be configured to establish an electrical connection without penetrating circuit board 70. Specifically, these pinless connectors (e.g., pinless connector 200) may be similar to the type of connectors utilized on surface mount devices, wherein these pinless connectors (e.g., pinless connector 200) are electrically coupled to conductive traces (not shown) included on circuit board 70 using e.g., a reflow solder process. These connectors (namely board connectors 78, 146 and drive connectors 76, 104) may be configured to include one or more alignment pins (e.g., alignment pins 202, 204) that may be configured to properly locate and secure the connector (e.g., board connectors 78, 146 and/or drive connectors 76, 104) on circuit board 70

As is known in the art, a reflow soldering process utilizes solder paste to temporarily attach electrical components (e.g., board connectors 78, 146 and drive connectors 76, 104) to their contact pads on a circuit board (e.g., circuit board 70), after which the entire assembly is subjected to controlled heat that melts the solder paste and solidifies the electrical connection. The controlled heating process may be accomplished by passing the assembly through a reflow oven.

Having thus described the disclosure of the present application in detail and by reference to embodiments thereof, it will be apparent that modifications and variations are possible without departing from the scope of the disclosure defined in the appended claims.

What is claimed is:
1. A mid-plane assembly for use in an IT device comprising:
 a circuit board having a first surface and a second surface;
 at least one drive connector positioned on the first surface of the circuit board; and
 at least one board connector positioned on the second surface of the circuit board and at least partially behind the at least one drive connector positioned on the first surface.

2. The mid-plane assembly of claim 1 wherein the at least one drive connector includes one or more pinless electrical connectors.

3. The mid-plane assembly of claim 2 wherein the one or more pinless electrical connectors of the at least one drive connector are electrically coupled to the circuit board using a reflow solder process.

4. The mid-plane assembly of claim 1 wherein the at least one board connector includes one or more pinless electrical connectors.

5. The mid-plane assembly of claim 4 wherein the one or more pinless electrical connectors of the at least one board connector are electrically coupled to the circuit board using a reflow solder process.

6. The mid-plane assembly of claim 1 wherein the at least one drive connector includes a plurality of drive connectors that are configured to electrically couple the circuit board to a plurality of disk drives.

7. The mid-plane assembly of claim 6 wherein the at least one board connector is configured to electrically couple the circuit board to a drive controller system that is configured to access the plurality of disk drives.

8. The mid-plane assembly of claim 1 wherein the at least one board connector includes a plurality of board connectors that are configured to electrically couple the circuit board to a drive controller system.

9. The mid-plane assembly of claim 1 wherein the circuit board includes a plurality of cooling passages configured to allow for the circulation of cooling air.

10. The mid-plane assembly of claim 1 wherein the mid-plane assembly is configured for use in a high availability storage system.

11. An IT device comprising:
a system board;
a drive controller system electrically coupled to the system board; and
a mid-plane assembly electrically coupled to the drive controller system, the mid-plane assembly including:
a circuit board having a first surface and a second surface;
at least one drive connector positioned on the first surface of the circuit board; and
at least one board connector positioned on the second surface of the circuit board and at least partially behind the at least one drive connector positioned on the first surface.

12. The IT device of claim 11 wherein the at least one drive connector includes one or more pinless electrical connectors.

13. The IT device of claim 12 wherein the one or more pinless electrical connectors of the at least one drive connector are electrically coupled to the circuit board using a reflow solder process.

14. The IT device of claim 11 wherein the at least one board connector includes one or more pinless electrical connectors.

15. The IT device of claim 14 wherein the one or more pinless electrical connectors of the at least one board connector are electrically coupled to the circuit board using a reflow solder process.

16. The IT device of claim 11 wherein the at least one drive connector includes a plurality of drive connectors that are configured to electrically couple the circuit board to a plurality of disk drives.

17. The IT device of claim 16 wherein the at least one board connector is configured to electrically couple the circuit board to the drive controller system, wherein the drive controller system is configured to access the plurality of disk drives.

18. The IT device of claim 11 wherein the at least one board connector includes a plurality of board connectors that are configured to electrically couple the circuit board to the drive controller system.

19. The IT device of claim 11 wherein the circuit board includes a plurality of cooling passages configured to allow for the circulation of cooling air.

20. The IT device of claim 11 wherein the IT device is configured for use in a high availability storage system.

21. A mid-plane assembly for use in an IT device comprising:
a circuit board having a first surface and a second surface;
at least one drive connector positioned on the first surface of the circuit board, wherein the at least one drive connector includes one or more pinless electrical connectors; and
at least one board connector positioned on the second surface of the circuit board and at least partially behind the at least one drive connector positioned on the first surface, wherein the at least one board connector includes one or more pinless electrical connectors.

22. The mid-plane assembly of claim 21 wherein the at least one drive connector includes a plurality of drive connectors that are configured to electrically couple the circuit board to a plurality of disk drives.

23. The mid-plane assembly of claim 22 wherein the at least one board connector is configured to electrically couple the circuit board to a drive controller system that is configured to access the plurality of disk drives.

24. The mid-plane assembly of claim 21 wherein the circuit board includes a plurality of cooling passages configured to allow for the circulation of cooling air.

25. The mid-plane assembly of claim 21 wherein the mid-plane assembly is configured for use in a high availability storage system.

* * * * *